(12) United States Patent
Benthien et al.

(10) Patent No.: US 11,492,142 B2
(45) Date of Patent: Nov. 8, 2022

(54) TOLERANCE COMPENSATION SUBASSEMBLY, AIRCRAFT COMPONENT PROVIDED THEREWITH AND AIRCRAFT

(71) Applicant: Airbus Operations GmbH, Hamburg (DE)

(72) Inventors: Hermann Benthien, Hamburg (DE); Matthias Hegenbart, Hamburg (DE); Peter Linde, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 211 days.

(21) Appl. No.: 16/859,162

(22) Filed: Apr. 27, 2020

(65) Prior Publication Data

US 2020/0339283 A1 Oct. 29, 2020

(30) Foreign Application Priority Data

Apr. 29, 2019 (DE) ...................... 10 2019 111 001.7

(51) Int. Cl.
  *B64F 5/10* (2017.01)
  *B64F 5/50* (2017.01)
  *B23P 19/10* (2006.01)
  *B64C 1/06* (2006.01)

(52) U.S. Cl.
  CPC ................ *B64F 5/10* (2017.01); *B23P 19/10* (2013.01); *B64F 5/50* (2017.01); *B23P 2700/01* (2013.01); *B64C 1/069* (2013.01)

(58) Field of Classification Search
  CPC .... B64F 5/10; B64F 5/50; B23P 19/10; B23P 2700/01; B23P 19/066; B64C 1/069; F16B 1/0014; B64D 11/00; H01L 41/193
  See application file for complete search history.

(56) References Cited

U.S. PATENT DOCUMENTS

| | | | | |
|---|---|---|---|---|
| 3,749,435 A | * | 7/1973 | Balzano | E05B 47/0047 292/341.16 |
| 3,905,669 A | * | 9/1975 | McCormick | H01R 13/631 439/380 |
| 4,456,206 A | * | 6/1984 | Tijssen | B64D 11/00 410/127 |

(Continued)

FOREIGN PATENT DOCUMENTS

| | | |
|---|---|---|
| CN | 203092581 U | 7/2013 |
| DE | 10345867 A1 | 4/2005 |

(Continued)

OTHER PUBLICATIONS

European Search Report for corresponding European Patent Application No. 20171124 dated Nov. 3, 2020.

*Primary Examiner* — Lawrence Averick

(74) *Attorney, Agent, or Firm* — Greer, Burns & Crain, Ltd.

(57) ABSTRACT

A tolerance compensation subassembly in the form of a tolerance compensation element or a tolerance compensation region to improve the production, maintenance and repair of aircraft. The tolerance compensation subassembly contains an actuator which is formed from an electro-active polymer so that the tolerance compensation subassembly is electrically switchable between a fixed state and a non-fixed state. As a result, automation of the assembly of aircraft components on each other can be enabled or facilitated.

17 Claims, 11 Drawing Sheets

(56) References Cited

U.S. PATENT DOCUMENTS

| | | | | |
|---|---|---|---|---|
| 6,778,728 | B2* | 8/2004 | Taylor | G02B 6/3584 359/224.1 |
| 7,013,538 | B2* | 3/2006 | Browne | F16B 5/07 24/604 |
| 7,836,794 | B2* | 11/2010 | Fujioka | B23P 19/066 73/761 |
| 8,221,043 | B2* | 7/2012 | Guyton | B29C 65/66 411/432 |
| 8,246,100 | B2 | 8/2012 | Cafeo et al. | |
| 8,763,231 | B2* | 7/2014 | Rule | F16B 1/0014 29/447 |
| 10,046,377 | B2* | 8/2018 | Batt | B21D 39/00 |
| 10,359,066 | B2* | 7/2019 | Hassounah | F16B 5/025 |
| 10,533,597 | B2* | 1/2020 | Benthien | F16B 37/085 |
| 11,060,545 | B2* | 7/2021 | Benthien | F16D 1/116 |
| 2003/0031403 | A1* | 2/2003 | Taylor | G02B 6/3584 359/872 |
| 2004/0074069 | A1* | 4/2004 | Browne | F16B 1/0014 24/442 |
| 2007/0204792 | A1* | 9/2007 | Kang | C23C 16/4481 118/302 |
| 2008/0213062 | A1* | 9/2008 | Johnson | F16B 35/02 411/395 |
| 2009/0178255 | A1* | 7/2009 | Maciejewski | B60R 13/04 24/697.1 |
| 2009/0208307 | A1* | 8/2009 | Guyton | B29C 65/56 411/379 |
| 2010/0242256 | A1 | 9/2010 | Gorr et al. | |
| 2010/0309702 | A1 | 12/2010 | Yuan et al. | |
| 2013/0081461 | A1 | 4/2013 | Classen et al. | |
| 2015/0082605 | A1* | 3/2015 | Batt | B21D 39/00 29/505 |
| 2016/0025242 | A1* | 1/2016 | Benthien | F16L 3/137 248/70 |
| 2016/0369826 | A1* | 12/2016 | Hassounah | B23P 19/10 |
| 2017/0350437 | A1* | 12/2017 | Benthien | F16B 37/085 |
| 2019/0264724 | A1* | 8/2019 | Benthien | F16B 21/186 |
| 2020/0052185 | A1 | 2/2020 | Hilgers et al. | |

FOREIGN PATENT DOCUMENTS

| | | |
|---|---|---|
| DE | 102005062470 A1 | 7/2007 |
| DE | 102008010055 A1 | 4/2009 |
| DE | 102010035265 A1 | 3/2012 |
| DE | 102012220987 A1 | 5/2014 |
| DE | 102015001463 A1 | 8/2016 |
| EP | 2239792 A1 | 10/2010 |
| EP | 3254951 A1 | 12/2017 |
| EP | 3281860 A1 | 2/2018 |
| EP | 3367451 A1 | 8/2018 |
| WO | 2012155276 A1 | 11/2012 |
| WO | 2014194904 A1 | 12/2014 |

* cited by examiner

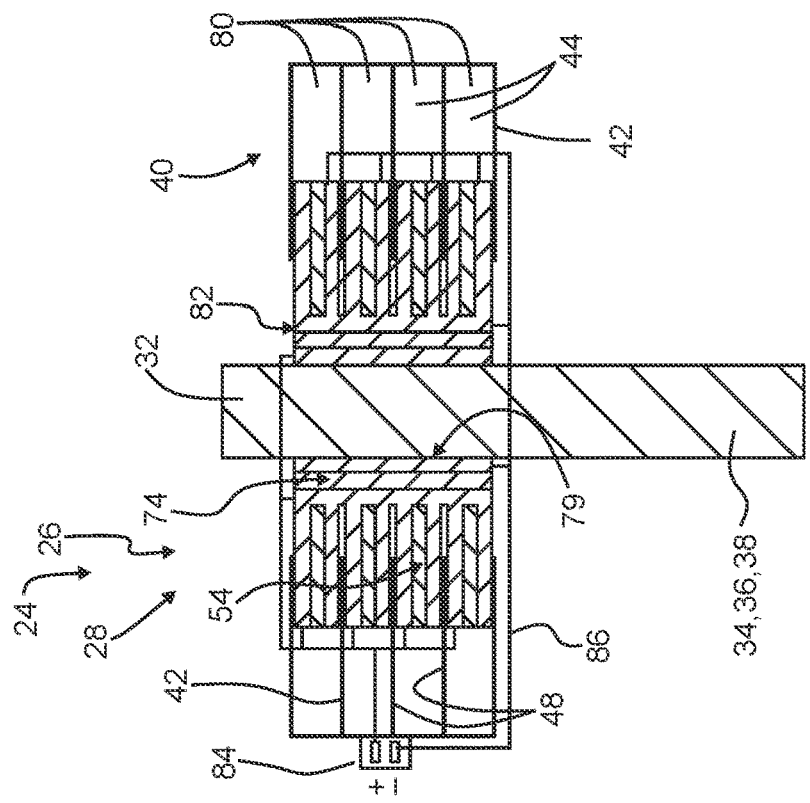
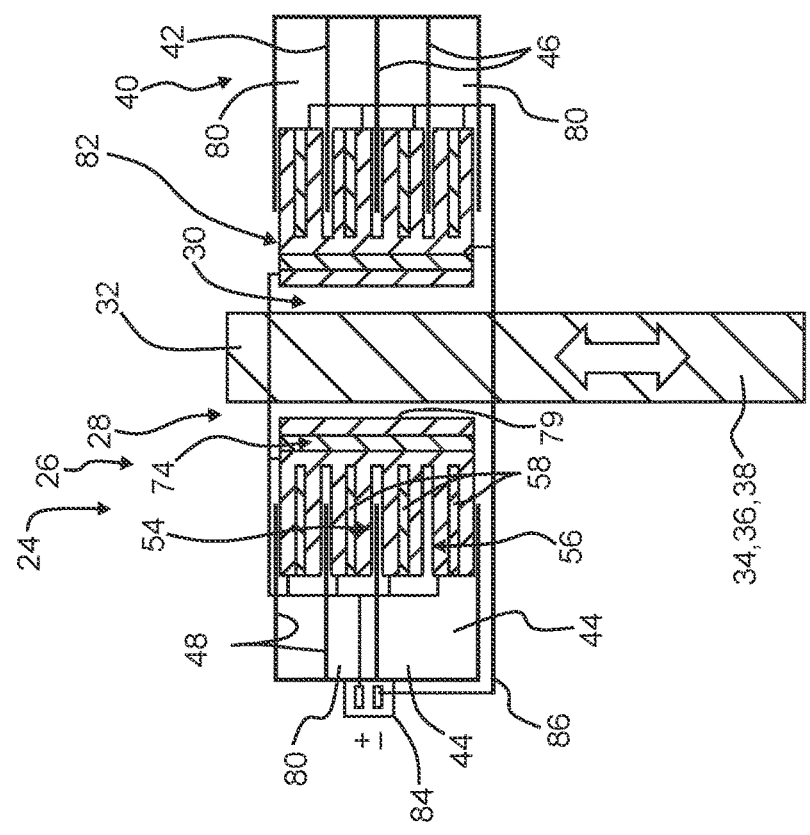
Fig. 6

TOLERANCE COMPENSATION SUBASSEMBLY, AIRCRAFT COMPONENT PROVIDED THEREWITH AND AIRCRAFT

CROSS-REFERENCES TO RELATED APPLICATIONS

This application claims the benefit of the German patent application No. 10 2019 111 001.7 filed on Apr. 29, 2019, the entire disclosures of which are incorporated herein by way of reference.

FIELD OF THE INVENTION

The invention relates to a tolerance compensation subassembly. The invention further relates to an aircraft component and an aircraft having such a tolerance compensation subassembly.

BACKGROUND OF THE INVENTION

Modern manufacture of aircraft is partially modularized. Different aircraft components, such as, for example, the fuselage, the wings, the tail unit or cockpit and the like, are produced as modules and assembled in the Final Assembly Line (FAL) to form a finished aircraft. In particular, the inner fitting of fuselage modules is an example of high production complexity.

Thus, fuselage modules, in which the passenger cabin is intended to be received, are produced separately from the cabin modules which form the passenger cabin. The cabin modules are inserted into the fuselage modules by means of a so-called jig and fixed thereto. Although the air travel components are subject to strict quality controls, it is never possible to completely avoid specific production tolerances. These production tolerances are supposed to be compensated for during installation of the corresponding aircraft component so that overall a component compliant with dimensions can be produced.

Fixing locations, for example, for the cabin module in the fuselage module can therefore be provided by means of tolerance compensation subassemblies which compensate for production tolerances—often simply in the few mm range or ¹/₁₀ mm range—and which bring about a secure fixing of the cabin module to the fuselage module.

Such tolerance compensation subassemblies are well known, but may cause a high level of complexity during installation and fixing of the aircraft components to each other.

Reference may be made to the following documents for the prior art:
EP 2 239 792 A1
WO 2012/0 155 276 A1
DE 10 2005 062 470 A1
US 2010/0 309 702 A1
DE 10 2015 001 463 A1
US 2004/0 074 069 A1
CN 203 092 581 U
WO 2014/0 194 904 A1
DE 10 2012 220 987 A1
DE 103 45 867 A1
DE 10 2010 035 265 A1

SUMMARY OF THE INVENTION

An object of the invention is to improve the production, maintenance and repair of aircraft.

The invention provides a tolerance compensation subassembly which is constructed to compensate for a dimensional tolerance between a plurality of aircraft components which are intended to be fixed to each other, wherein the tolerance compensation subassembly comprises a fixing region for one of the aircraft components and a fixing actuator which contains an electro-active material, in particular an electro-active polymer, and which is thereby electrically switchable between a fixed state, in which the fixing region is fixed, and a non-fixed state, in which the fixing region is displaceable.

It is preferable for the fixing actuator to be in the fixed state when no voltage is applied.

It is preferable for the fixing actuator to be in the non-fixed state as long as a voltage is applied.

It is preferable for the fixing region to be partially arranged on the fixing actuator so that the fixing region can be displaced by displacing the fixing actuator.

It is preferable for the fixing region to be displaceable, in the non-fixed state, parallel with a displacement plane which is defined by the fixing actuator.

It is preferable for the fixing region to comprise a fixing opening which is formed in the fixing actuator so that the fixing opening can be displaced by displacing the fixing actuator.

It is preferable for the fixing actuator to be arranged in a hollow space, wherein the fixing actuator in the fixed state grips in a positive-locking or non-positive-locking manner for fixing a region of the hollow space.

It is preferable for the fixing actuator to be displaceable in the non-fixed state within the hollow space.

It is preferable for the fixing actuator to have an actuator fixing region which grips in the fixed state in a positive-locking or non-positive-locking manner for fixing another fixing region.

It is preferable for the hollow space to have a hollow space fixing region which grips in the fixed state in a positive-locking or non-positive-locking manner for fixing another fixing region.

It is preferable for the hollow space fixing region to have a tooth structure and/or a friction coating for fixing.

It is preferable for the actuator fixing region to have a tooth structure and/or a friction coating for fixing.

It is preferable for the fixing actuator to be constructed in a plate-like manner.

The tolerance compensation subassembly preferably comprises a housing which delimits a plurality of hollow spaces.

It is preferable for the fixing actuator to be constructed as a stack actuator with a plurality of actuator elements.

It is preferable for each hollow space to contain an actuator element.

Preferably, the tolerance compensation subassembly comprises a bolt fixing actuator for fixing a fixing bolt. It is preferable for the fixing region to have a fixing bolt. It is preferable for the bolt fixing actuator to contain an electro-active material, in particular an electro-active polymer, and thereby to be electrically switchable between a fixed state, in which the fixing bolt is fixed, and a non-fixed state, in which the fixing bolt is displaceable along the longitudinal axis thereof.

It is preferable for the bolt fixing actuator to be constructed as part of the fixing actuator and to preferably delimit the fixing opening in a radial direction.

It is preferable for the bolt fixing actuator to be arranged on the peripheral face of the fixing bolt.

The invention provides an aircraft component, in particular a fuselage module or a cabin module, of an aircraft, wherein the aircraft component comprises a preferred tolerance compensation subassembly.

The invention provides an aircraft, in particular an airplane, having a preferred tolerance compensation subassembly and/or a preferred aircraft component.

Advantages and effects of the invention are explained in greater detail below. It should be noted that not all the advantages or effects have to be implemented at the same time or in the same manner.

The invention is generally based on the notion of at least partially automating the previously purely mechanical tolerance compensation by means of a fixing actuator. The fixing actuator contains an electro-active material, for example, an electro-active polymer, which is also known as artificial muscle, for example, in the field of robotics. Electro-active polymers (EAP) change their shape in the event of application of an external electrical voltage and can bring about a substantially higher deformation in comparison with piezoelectric ceramic materials.

Individual electro-active polymers may achieve expansions up to almost 400%. Typical expansions are approximately from 30% to 100%. The tolerance compensation subassembly with a tolerance compensation element which contains electro-active polymer allows a completely automated tolerance compensation of components which are intended to be fixed to each other, such as, for example, aircraft components, in the x, y and z direction. In this case, the EAP tolerance compensation element is activated with an electric voltage so that, for example, a central bolt is movable. Any tolerances can thereby be compensated for, that is to say, in three spatial directions.

After the voltage has been switched off, the EAP actuator elements are no longer activated and the bolt position is fixed. Fine adjustment is also possible. The adjustment can be carried out with a precision of less than one-tenth of a millimeter so that a precise positioning of the fuselage structure relative to the cabin and additional system elements is possible. It is also conceivable for production robots to position the components relative to each other and to fix them to each other by controlling the tolerance compensation subassembly. The positioning and fixing of the components with respect to each other can thereby be carried out more rapidly so that the complexity and therefore also the costs can be reduced with the quality being increased at the same time.

BRIEF DESCRIPTION OF THE DRAWINGS

Embodiments are explained in greater detail with reference to the appended schematic drawings. In the drawings:

FIG. 6 illustrates a tolerance compensation in the X direction;

DETAILED DESCRIPTION OF THE PREFERRED EMBODIMENTS

Figure 1:
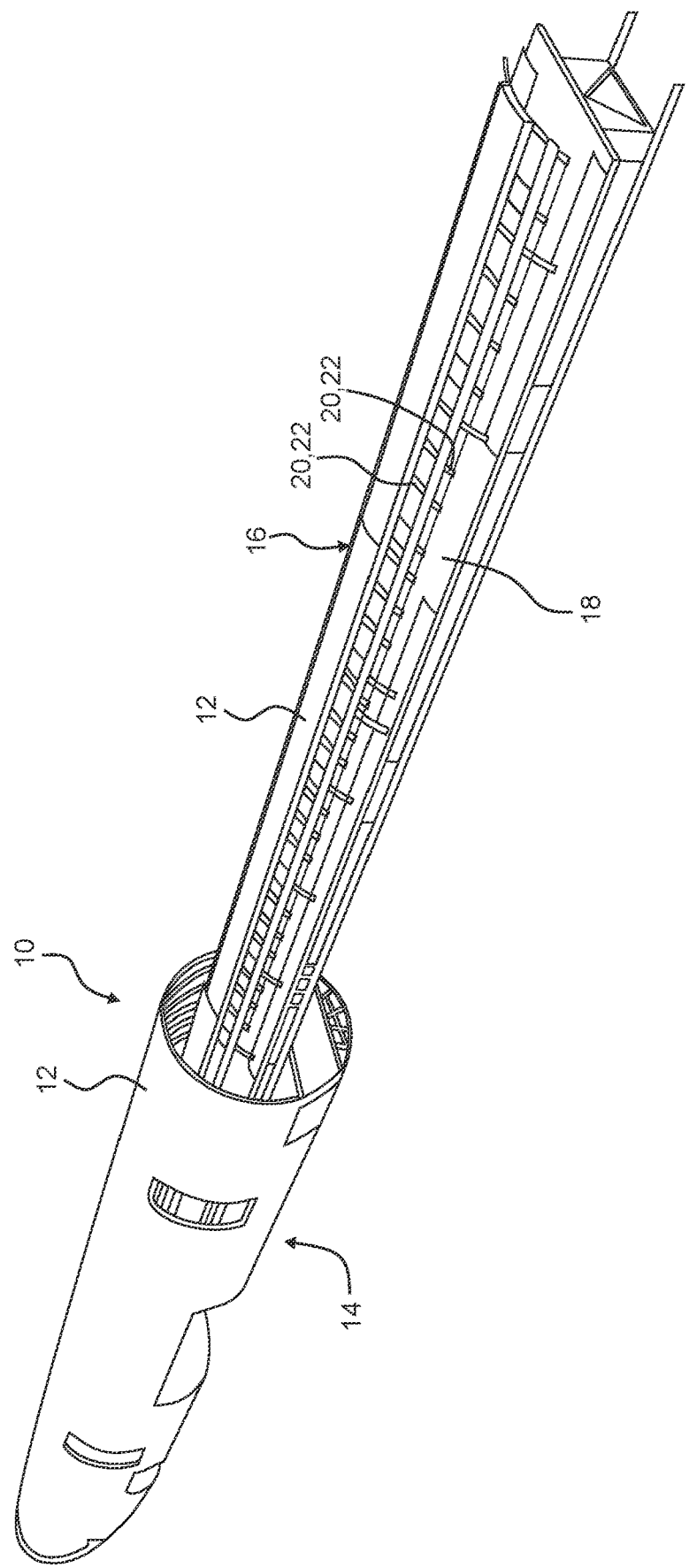
FIG. 1 shows an embodiment of a fuselage module and a cabin module.

Reference is made below to FIG. 1 which partially shows an aircraft 10.

The aircraft 10 is assembled from a plurality of aircraft components 12. In this instance, a fuselage structure 14, in which a cabin ceiling module 16 is inserted and is intended to be fixed to the fuselage structure 14, act as examples. The cabin ceiling module 16 is preferably inserted by means of a so-called jig 18 in the fuselage structure 14.

In order to fix the cabin ceiling module 16, there are provided a plurality of fixing locations 20 which constitute a corresponding fixing interface 22.

Figure 2:
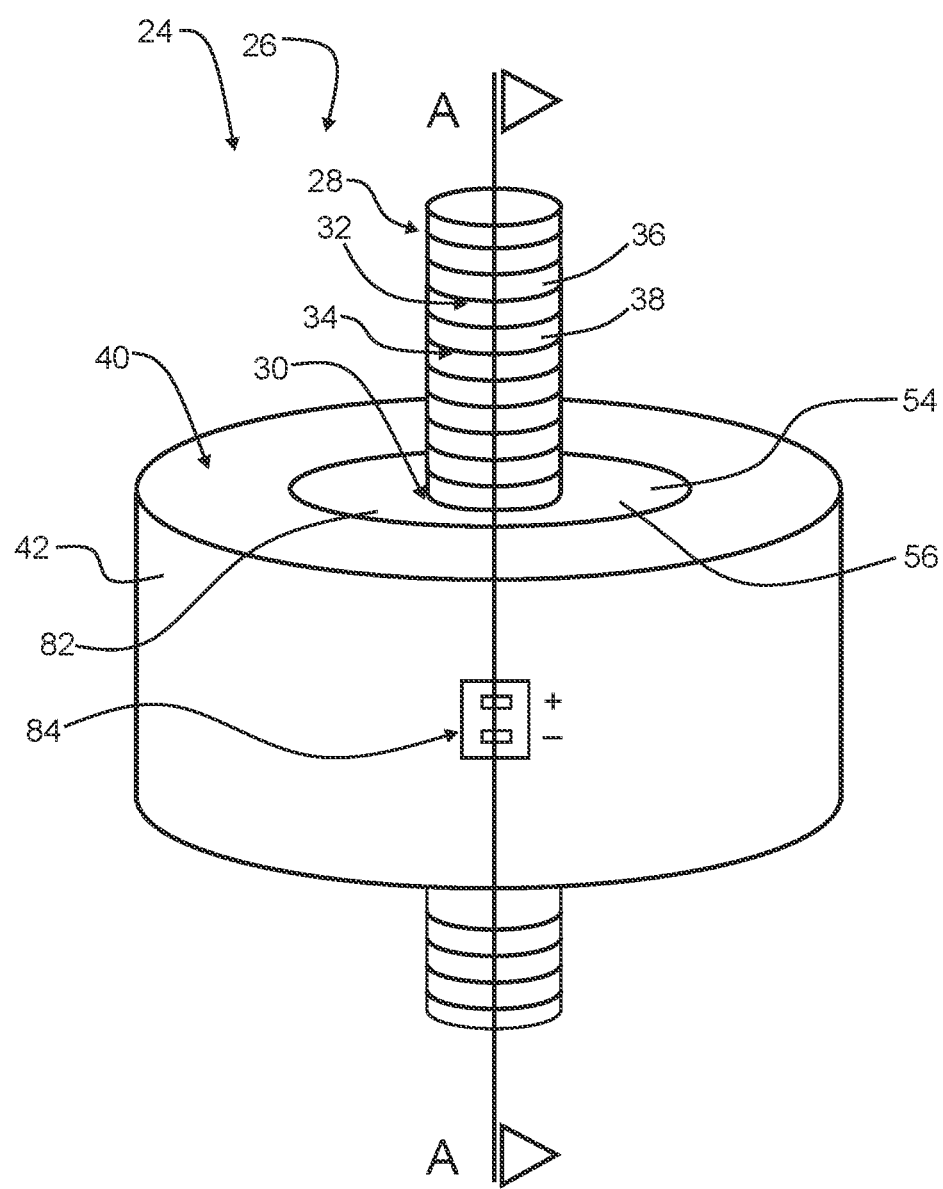
FIG. 2 shows an embodiment of a tolerance compensation element.

The fixing location 20 may have a tolerance compensation subassembly 24, an example of which is illustrated in FIG. 2.

Reference is made below to FIGS. 2 to 6 which show the tolerance compensation subassembly 24 in the form of a tolerance compensation element 26.

The tolerance compensation element 26 comprises a first fixing region 28 for the aircraft component 12, for example, for the fuselage structure 14. The first fixing region 28 may have a fixing opening 30. Furthermore, the first fixing region 28 may comprise a fixing bolt 32 which can be fixed in the fixing opening 30.

The fixing bolt 32 is preferably constructed in a substantially cylindrical manner. The fixing bolt 32 may have a bolt fixing region 34 at the peripheral face thereof. The bolt fixing region 34 is constructed to allow a non-positive-locking and/or positive-locking connection. The bolt fixing region 34 may have a tooth structure 36 and, alternatively or additionally, a friction coating 38.

The tolerance compensation element 26 comprises a second fixing region 40 for an additional aircraft component 12, such as, for example, the cabin ceiling module 16. The second fixing region 40 may comprise a housing 42 which is fixed to the cabin ceiling module 16. The fixing may be carried out, for example, by means of welding or other fixing methods which are compatible with air travel.

Figure 3:
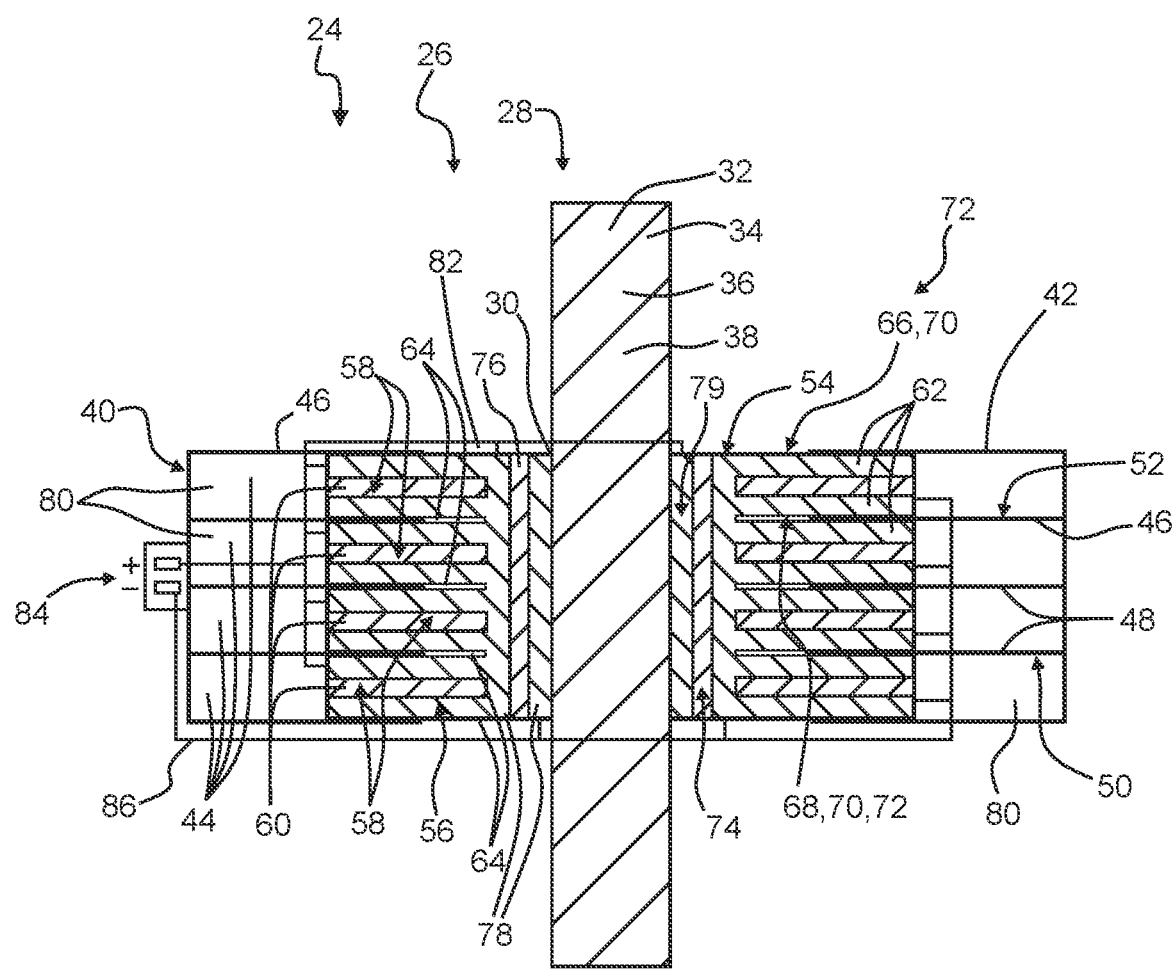
FIG. 3 is a cross-section along the axis A-A from FIG. 2 in the fixed state.

As can be seen particularly in FIG. 3, the housing 42 comprises a plurality of hollow spaces 44. The hollow spaces 44 are each defined by a housing wall 46 of the housing 42. In this case, the horizontally extending housing walls 46 may each have, as illustrated, for example, in FIG. 3, a hollow space fixing region 48. The hollow space fixing region 48 may—similarly to the bolt fixing region 34—have a tooth structure 50 and/or a friction coating 52.

The tolerance compensation element 26 further comprises a fixing actuator 54. The fixing actuator 54 is constructed, for example, as a stack actuator 56. The fixing actuator 54 has a plurality of actuator elements 58.

The actuator element 58 comprises an actuator region 60 and a respective electrode region 62 which adjoins it. The actuator region 60 and the electrode regions 62 may have the same thicknesses. The actuator region 60 and the electrode regions 62 may alternatively also have different thicknesses.

At least the actuator region 60 contains electro-active material, for example, in the form of an electro-active polymer. The electrode regions 62 can also contain the electro-active material, more specifically the electro-active polymer.

Furthermore, the actuator region 60 is preferably constructed in an electrically insulating manner while the electrode regions 62 can be constructed in an electrically conductive manner.

As a result of this configuration of the actuator element 58, the thickness thereof can be changed by applying an electric voltage to the electrode regions 62. Generally, therefore, the fixing actuator 54 can be electrically switched between different states by an electric voltage.

In the present example, the fixing actuator 54 is arranged in the plurality of hollow spaces 44. In particular, each hollow space 44 contains an actuator element 58.

The fixing actuator 54 comprises an actuator fixing region 64, which can be constructed on an upper actuator side 66 and/or a lower actuator side 68. The actuator fixing region 64 may comprise a tooth structure 70 and/or a friction coating 72.

The tolerance compensation element 26 may further comprise a bolt fixing actuator 74. The bolt fixing actuator 74 is preferably formed on the fixing actuator 54 and delimits the fixing opening 30 in a radial direction. The bolt fixing actuator 74 is constructed so as to complement the fixing bolt 32 so that the bolt fixing actuator 74 can grip in one state the fixing bolt 32 in a positive-locking and/or non-positive-locking manner preferably, the bolt fixing actuator 74 is constructed cylindrically.

The bolt fixing actuator 74 has an actuator region 76 and an electrode region 78. The actuator region 76 and the electrode region 78 can each be constructed in the manner of the actuator region 60 and the electrode region 62 so that they are not explained in greater detail.

The bolt fixing actuator 74 further comprises a bolt actuator fixing region 79 which is constructed to grip the fixing bolt 32 in a positive-locking and/or non-positive-locking manner. The bolt actuator fixing region 79 is arranged, in particular, on a radial inner face of the bolt fixing actuator 74.

The fixing actuator 54 is preferably constructed as an integral element.

The tolerance compensation element 26 further comprises a hollow space free region 80 which is preferably provided in the hollow space 44 and which is defined by the housing 42 and the fixing actuator 54. The hollow space free region 80 allows movement of the fixing actuator 54 in a y direction and in a z direction.

The tolerance compensation element 26 further comprises a bolt free region 82 which is defined in the y/z direction by the housing 42 and the fixing bolt 32. The bolt free region 82 also allows displacement of the fixing actuator 54 in the y/z direction.

Consequently, the fixing actuator 54 defines a displacement plane parallel with the y/z direction.

The tolerance compensation element 26 further comprises a connection device 84 in order to be able to apply the electric voltage which is necessary to activate the fixing actuator 54. The connection device 84 is electrically connected to the electrode region 62 and the electrode region 78 by means of a conduction structure 86. In this manner, by applying a voltage to the connection device 84, the fixing actuator 54 can be activated and deactivated. The tolerance compensation element 26 can thereby be electrically switched between a fixed state and a non-fixed state.

The operation of the tolerance compensation subassembly 24 is explained in greater detail below with reference to FIGS. 3 to 7.

Initially, the tolerance compensation subassembly 24 is in the fixed state which is illustrated, for example, in FIG. 3. In the fixed state, the first fixing region 28 cannot be displaced in any of the x/y/z directions. The fixing actuator 54 is configured in such a manner that the fixing actuator 54 grips the housing 42 in a positive-locking and/or non-positive-locking manner. In this case, in particular the bolt fixing region 34 is engaged with the bolt actuator fixing region 79. Furthermore, the hollow space fixing region 48 is engaged with the actuator fixing region 64. Therefore, the fixing actuator 54 is impeded from moving in the y/z direction relative to the housing 42. Furthermore, the fixing bolt 32 is thereby impeded from displacement in the x direction.

If two aircraft components 12, for example, the fuselage structure 14 and the cabin ceiling module 16, are intended to be fixed to each other, an electric voltage is applied to the fixing actuator 54 via the connection device 84.

As a result of the applied electric voltage, the thickness of the actuator region 60 and the actuator region 76 changes so that the fixing actuator 54 no longer grips the housing 42 and the fixing bolt 32 in a positive-locking or non-positive-locking manner. The fixing actuator 54 is displaceably supported by the housing 42. Furthermore, the fixing bolt 32 is released for displacement in the x direction by the thickness contraction of the actuator region 76.

Figure 5:
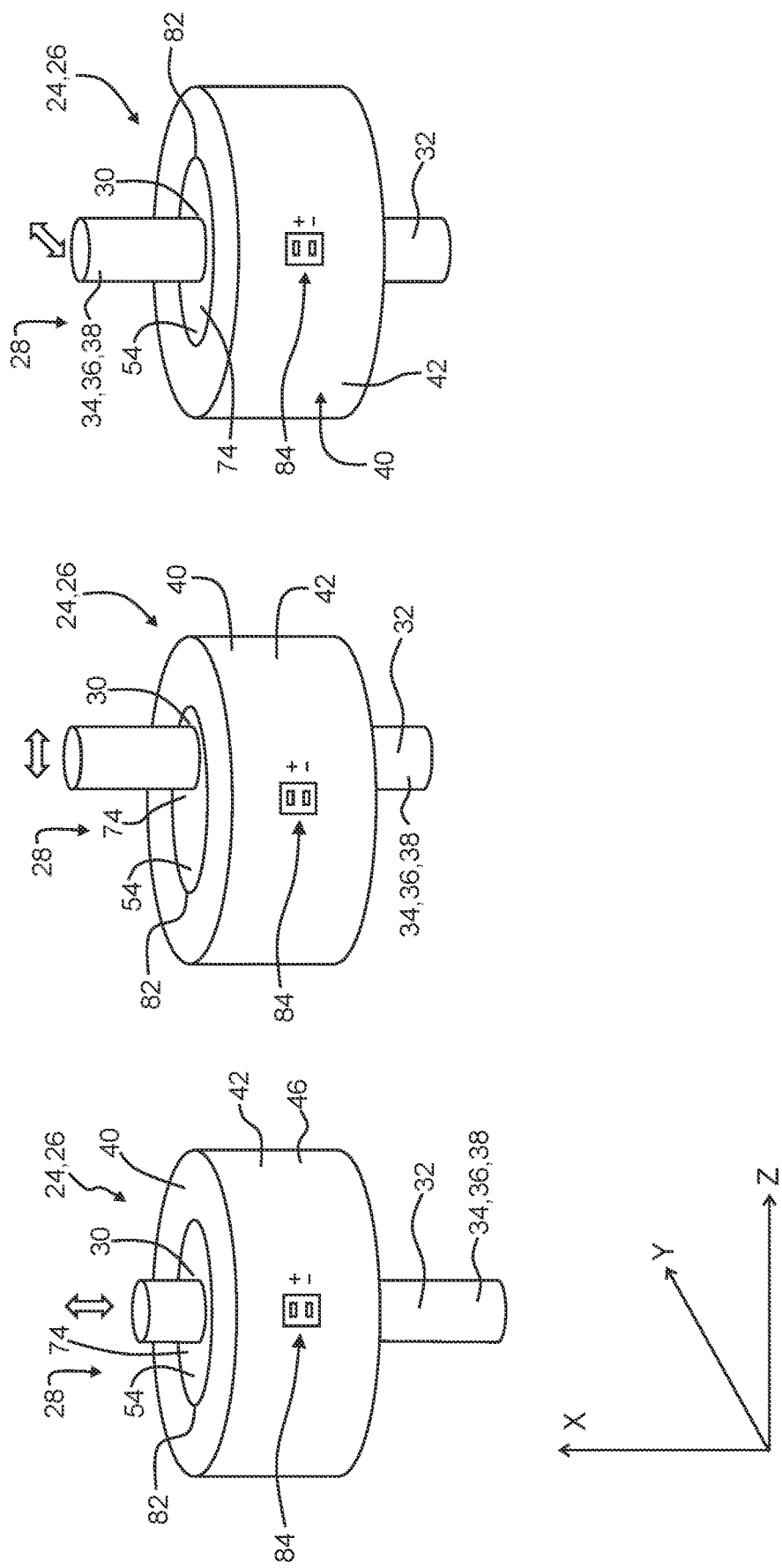
FIG. 5 illustrates a tolerance compensation in the X/Y/Z direction.

As illustrated in greater detail in FIG. 5 and FIG. 6, the fixing bolt 32 can be displaced in the x direction in the fixing opening 30 in order to compensate for a dimensional deviation as soon as and as long as an electric voltage is applied to the fixing actuator 54.

Figure 7:
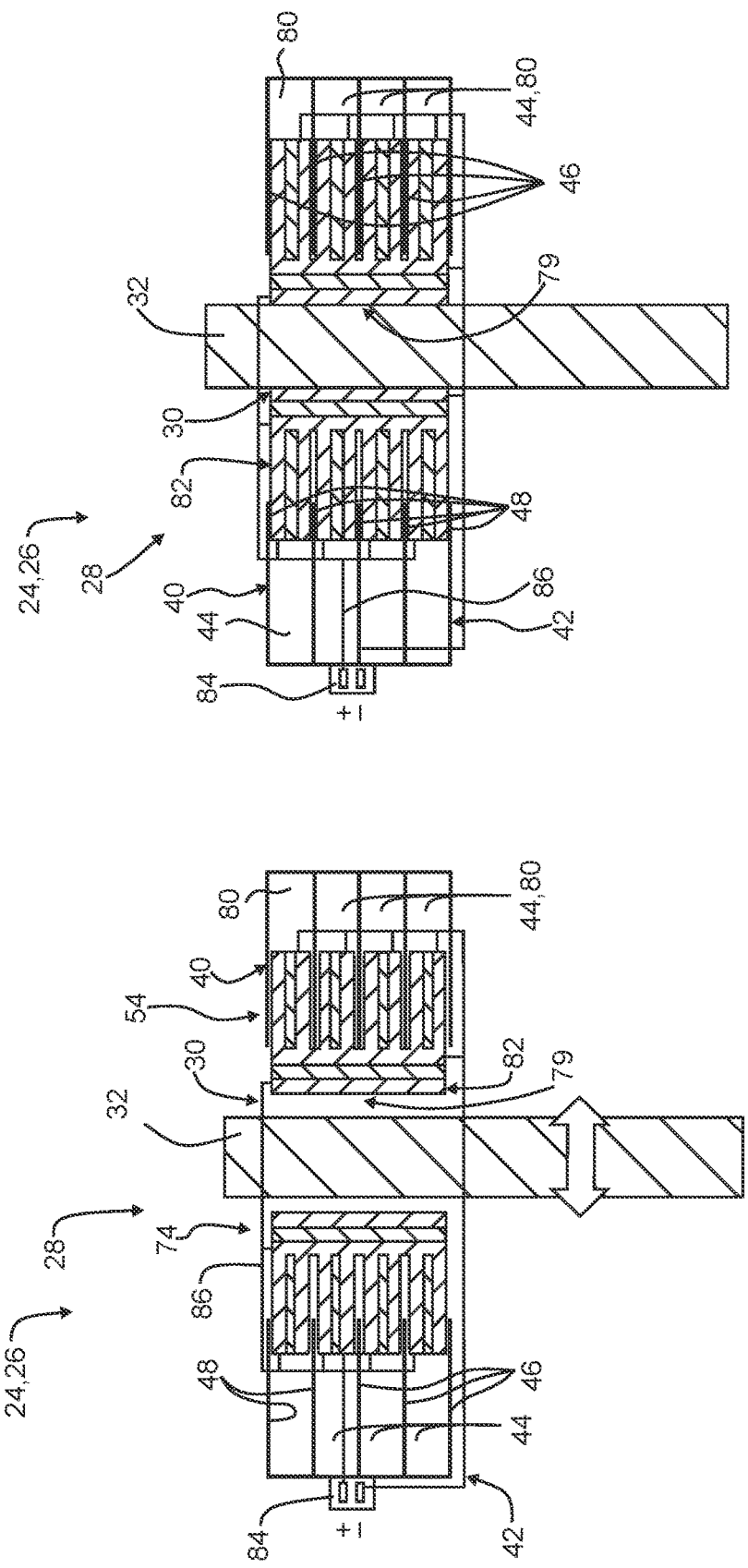
FIG. 7 illustrates a tolerance compensation in the Y/Z direction.

As further illustrated in greater detail in FIG. 5 and FIG. 7, after the adjustment of the fixing bolt 32 in the x direction, it can be displaced parallel with the displacement plane, that is to say, parallel with the y/z plane. Usually, a superimposed displacement movement is carried out.

Finally, the voltage can be switched off so that the fixing actuator 54 expands again to the original thickness thereof and grips the housing 42 and the fixing bolt 32 in a positive-locking and/or non-positive-locking manner. As a result, the dimensional deviations of the aircraft components 12 relative to each other are compensated for and the aircraft components 12 are fixed to each other. In addition, a securing of this fixing action can be carried out, for example, by screwing.

Figure 4:
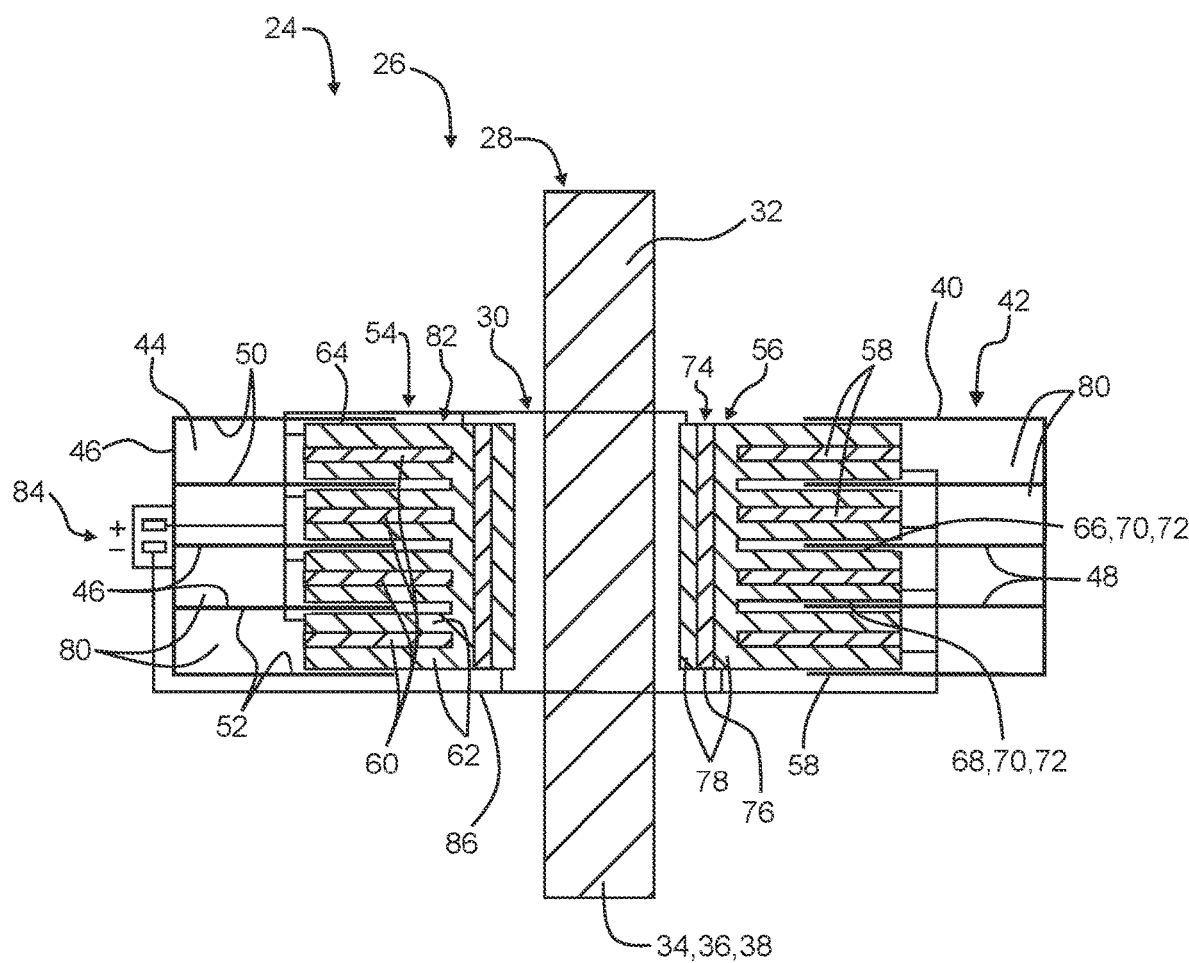
FIG. 4 is a cross-section along the axis A-A from FIG. 2 in the non-fixed state.

Overall, the first fixing region 28 is fixed in a fixed state, as illustrated, for example, in FIG. 3, while the first fixing region 28 is displaceable in a non-fixed state in the y/z direction and/or x direction, as illustrated, for example, in FIG. 4.

As a result of the electrical switching of the fixing actuator 54, a greater number of tolerance compensation subassemblies 24 can be actuated simultaneously. Furthermore, each individual tolerance compensation subassembly 24 can readily be adapted to the individual tolerance compensation of the corresponding fixing location 20. Consequently, less time is necessary overall in order to fix the aircraft components 12 to each other so that the entire production time for the aircraft 10 can be substantially reduced.

Reference is made below to FIGS. 8 to 11 which show an embodiment of a tolerance compensation subassembly 88. The tolerance compensation subassembly 88 is constructed as a tolerance compensation region 90 which is provided on the aircraft component 12.

The tolerance compensation region 90 comprises a first fixing region 92.

The first fixing region 92 may further have a first fixing opening 94 and a second fixing opening 96. Furthermore, the first fixing region 92 may comprise a fixing bolt 98.

The fixing bolt 98 is constructed in such a manner that the fixing bolt 98 can be introduced into the first fixing opening 94 and the second fixing opening 96. The fixing bolt 98 can be arranged and fixed, for example, on the fuselage structure 14.

The fixing bolt 98 is constructed in a substantially cylindrical manner and may comprise a bolt fixing region 100 on the peripheral face thereof. The bolt fixing region 100 can, for example, have a tooth structure 102 and/or a friction coating 104.

The tolerance compensation subassembly 88 further comprises a second fixing region 106 which is arranged on one of the aircraft components 12, for example, the cabin ceiling module 16.

The second fixing region 106 comprises a hollow space 108. The hollow space 108 is delimited by a hollow space wall 110. The hollow space wall 110 supports the second fixing opening 96 so that it can be displaced.

A hollow space fixing region 112 is further provided in the hollow space 108. The hollow space fixing region 112 is preferably arranged at two opposing sides of the hollow space 108. The hollow space fixing region 112 can comprise a tooth structure 114 and/or a friction coating 116. Preferably, the tooth structure 114 is constructed in such a manner that rows of teeth of the tooth structure 114 extend orthogonally to each other so that in a fixed state a displacement of the first fixing region 92 in the y/z direction is prevented.

The tolerance compensation region 90 further comprises a fixing actuator 118. The fixing actuator 118 is constructed in a substantially plate-like manner and preferably comprises a single actuator element 120. Although this is not illustrated in greater detail in FIGS. 8 to 11, the actuator element 120 is nevertheless constructed similarly to the actuator element 58. Therefore, a more detailed explanation is omitted.

The fixing actuator 118 contains an electro-active material, in particular an electro-active polymer. When an electric voltage is applied to the fixing actuator 118, the fixing actuator 118 contracts in the thickness direction.

The fixing actuator 118 preferably has an actuator fixing region 122, in particular on an upper actuator side 124 and/or lower actuator side 126. The actuator fixing region 64 may comprise a tooth structure 128 and/or a friction coating 130.

Furthermore, the tolerance compensation region 90 may have a bolt fixing actuator 132. The bolt fixing actuator 132 is preferably arranged on the peripheral face of the fixing bolt 98 and forms in particular the bolt fixing region 100. The bolt fixing actuator 132 further comprises a bolt actuator fixing region 134 which may have a tooth structure 136 and/or a friction coating 138.

Figure 9:
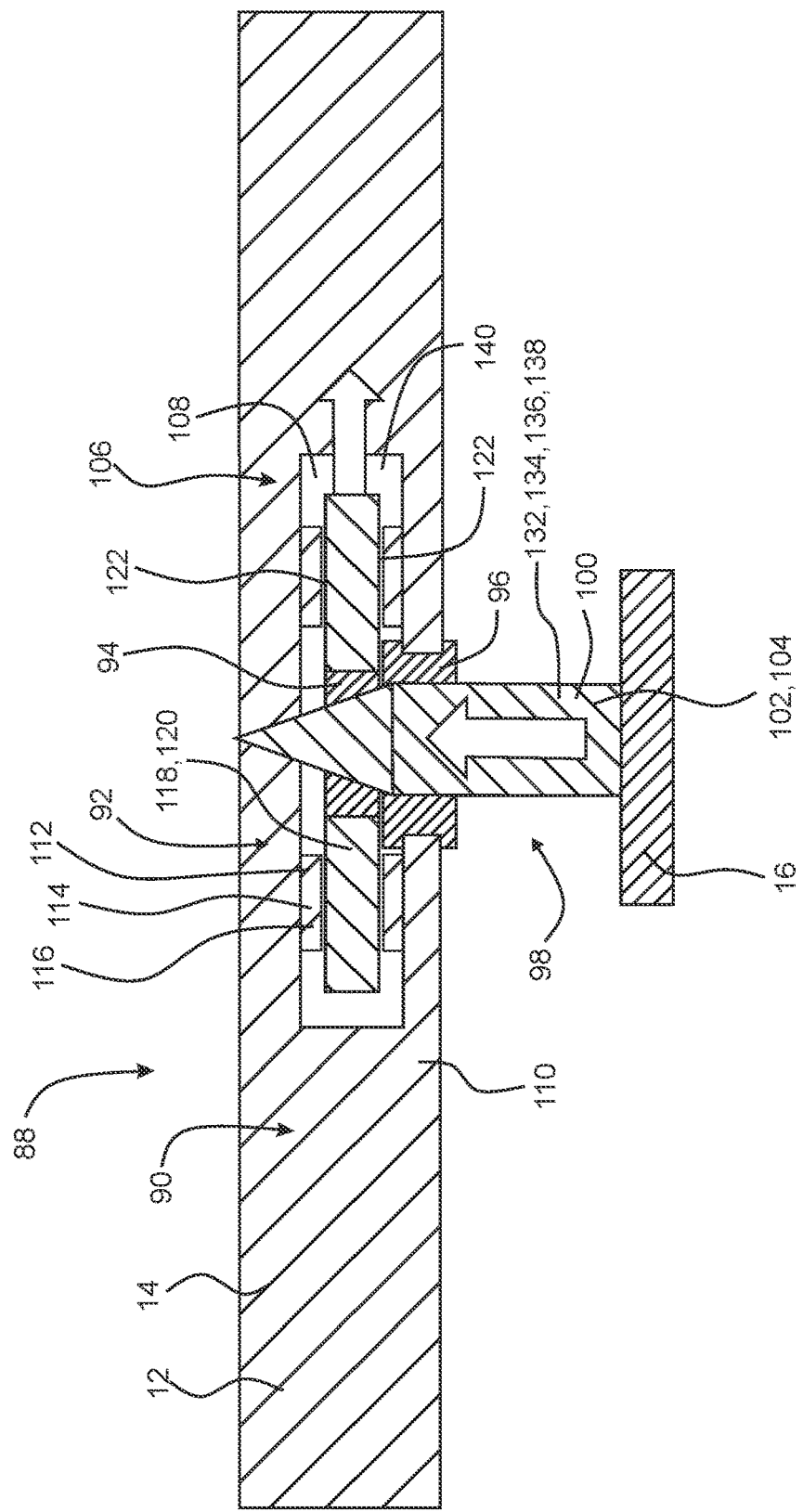
FIGS. 9 and 10 show a tolerance compensation in the X/Y/Z direction.

The tolerance compensation region 90 further comprises a hollow space free region 140 which allows a displacement along a displacement plane for the fixing actuator 118 in the non-fixed state, as illustrated, for example, in FIG. 9. The fixing actuator 118 is preferably arranged in the hollow space 108.

The operation of the tolerance compensation region is explained in greater detail below with reference to FIGS. 8 to 11.

Figure 8:
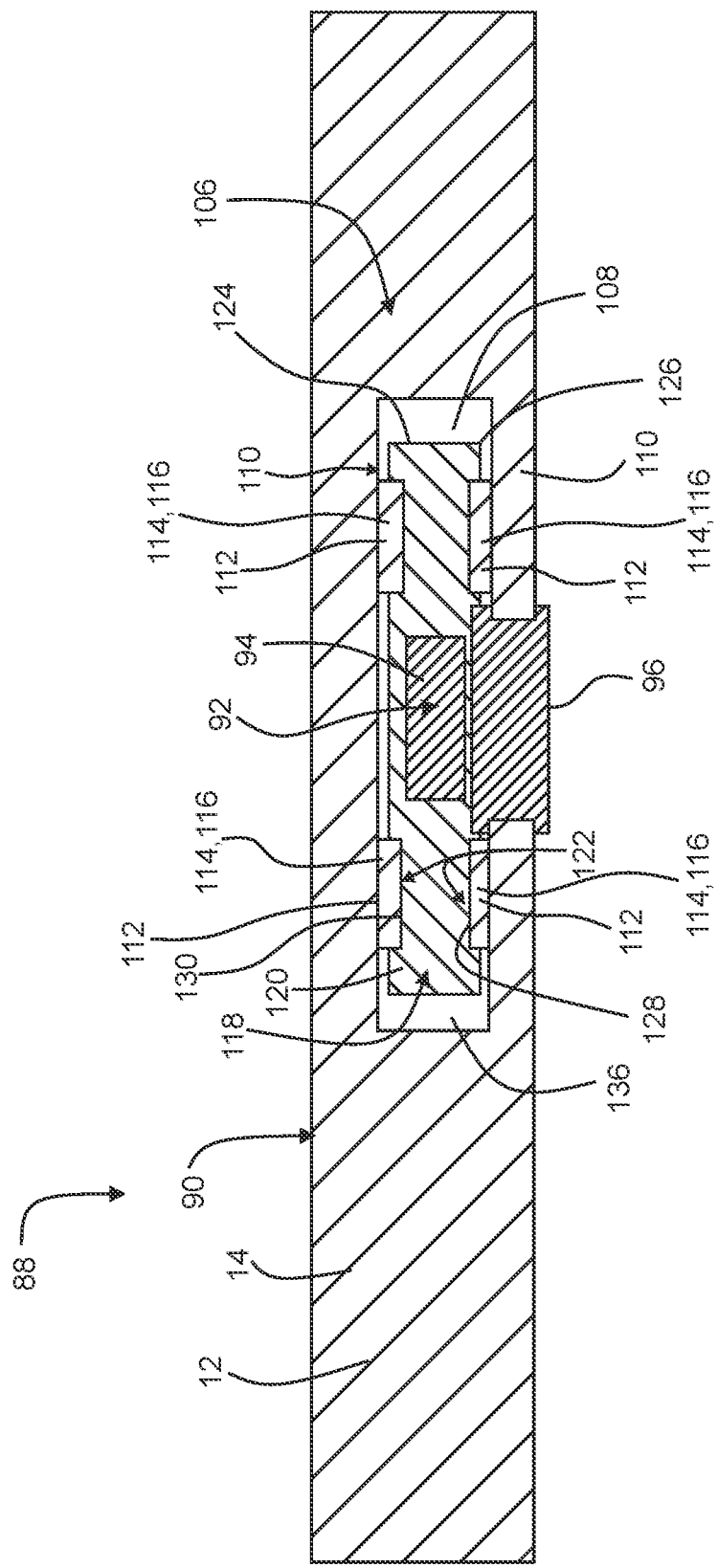
FIG. 8 shows an embodiment of a tolerance compensation subassembly in the fixed state.

In the fixed state which is illustrated in FIG. 8, no electric voltage is applied to the fixing actuator 118 so that it is fixed in the hollow space 108 to the hollow space wall 110. In this case, the hollow space fixing region 112 and the actuator fixing region 122 are in engagement so that they are connected to each other in a positive-locking and non-positive-locking manner.

Figure 10:
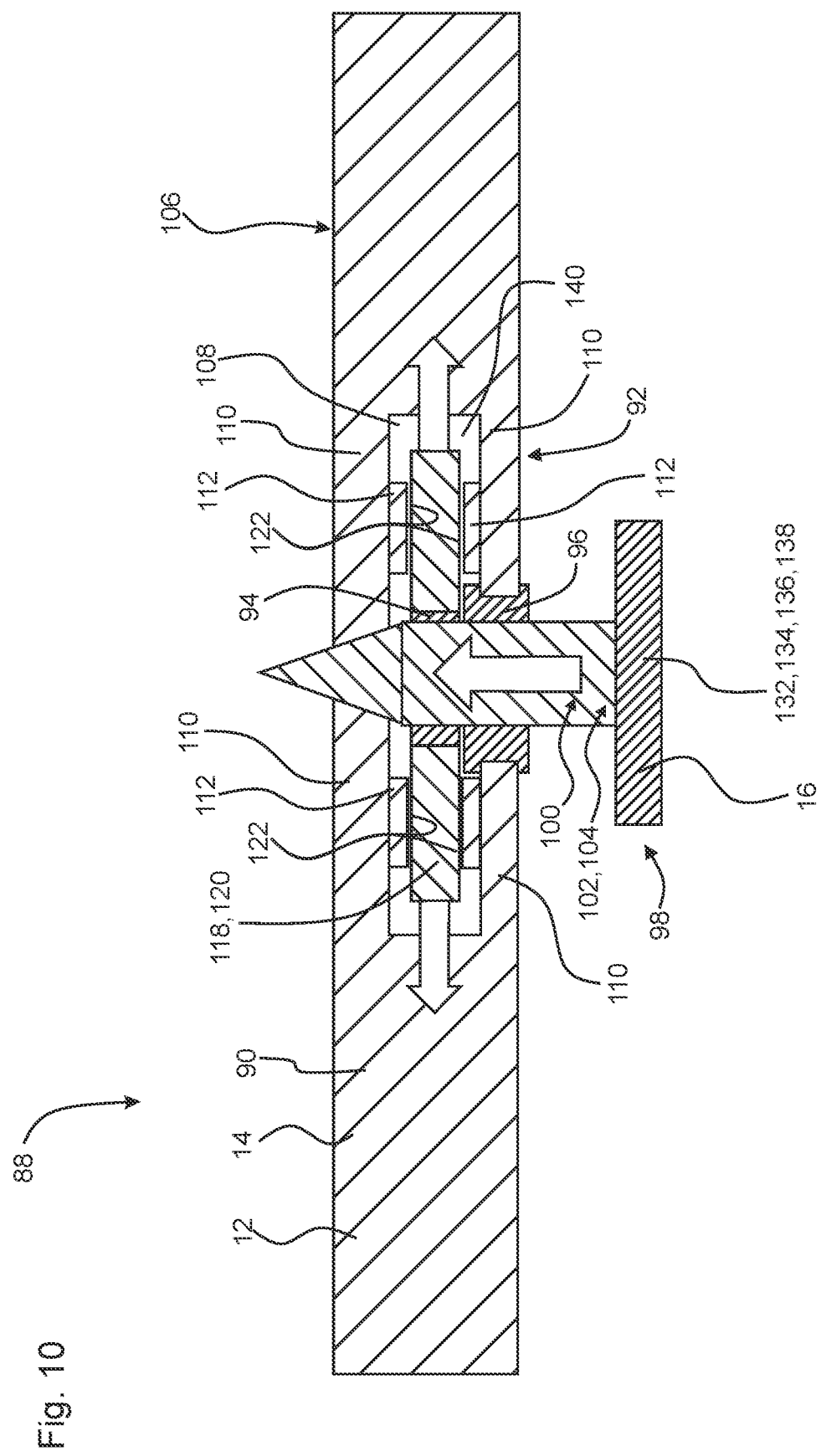
Figure 11:
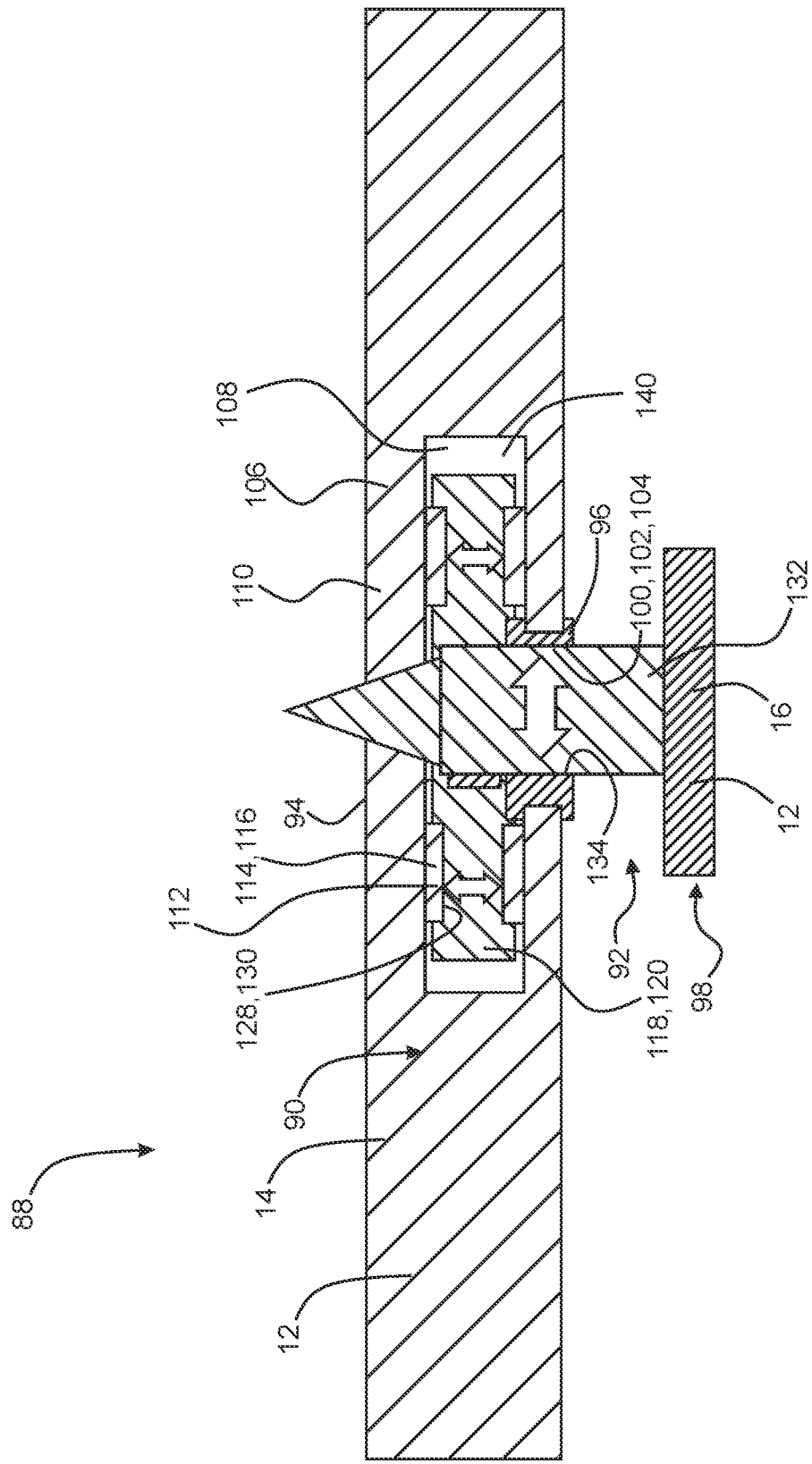
FIG. 11 shows the tolerance compensation subassembly after tolerance compensation in the fixed state.

Now, a voltage is applied to the fixing actuator 118 so that a non-fixed state results, as illustrated in FIGS. 9 to 11. The fixing actuator 118 is displaceably supported in the y/z plane, for example, by the hollow space wall 110.

Subsequently, the fixing bolt 98 is introduced into the first fixing opening 94 and the second fixing opening 96. The bolt fixing actuator 132 also receives a supply voltage so that the bolt fixing actuator 132 is in a non-fixed state. By the fixing bolt 98 being inserted, the fixing actuator 118 can be displaced in the y/z plane in order to compensate for the dimensional deviations.

By the introduction depth of the fixing bolt 98 being established, the compensation for the tolerance in the x direction is achieved. If the aircraft component 12, for example, the cabin ceiling module 16 is at the desired position, the supply voltage for the fixing actuator 118 and the bolt fixing actuator 132 is switched off so that the actuators 118, 132 expand again.

In this case, the fixing actuator 118 grips the hollow space fixing region 112 by means of the actuator fixing region 122 thereof while the bolt fixing actuator 132 grips, with the bolt actuator fixing region 134 thereof, the first fixing opening 94 and/or the second fixing opening 96 in a positive-locking and non-positive-locking manner. As a result, the aircraft components 12, for example, the fuselage structure 14 and the cabin ceiling module 16, are fixed to each other. The fixing can be secured by additional measures, such as, for example, screwing.

All the measures mentioned above allow inter alia automation of the installation or fixing of different aircraft components to each other. Thus, by simply applying voltage to the tolerance compensation subassemblies, at the same time a tolerance compensation at all the fixing locations can be carried out. This allows the aircraft components to be positioned and finally fixed, for example, by means of robots, so that overall the production complexity can be substantially reduced and the production duration and associated costs can also be reduced.

In summary, it may be noted that a tolerance compensation subassembly is provided in the form of a tolerance compensation element or a tolerance compensation region, with the objective of improving the production, maintenance and repair of aircraft. The tolerance compensation subassembly contains an actuator which is formed from an electro-active polymer so that the tolerance compensation subassembly can be electrically switched between a fixed state and a non-fixed state. As a result, automation of the assembly of aircraft components on each other can be enabled or facilitated.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

LIST OF REFERENCE NUMERALS

10 Aircraft
12 Aircraft component
14 Fuselage structure
16 Cabin ceiling module
18 Jig
20 Fixing location
22 Fixing interface
24 Tolerance compensation subassembly
26 Tolerance compensation element
28 First fixing region
30 Fixing opening
32 Fixing bolt
34 Bolt fixing region
36 Tooth structure
38 Friction coating
40 Second fixing region
42 Housing
44 Hollow space
46 Housing wall
48 Hollow space fixing region
50 Tooth structure
52 Friction coating
54 Fixing actuator
56 Stack actuator
58 Actuator element
60 Actuator region
62 Electrode region
64 Actuator fixing region
66 Upper actuator side
68 Lower actuator side
70 Tooth structure
72 Friction coating
74 Bolt fixing actuator
76 Actuator region
78 Electrode region
79 Bolt fixing region
80 Hollow space free region
82 Bolt free region
84 Connection device
86 Conduction structure
88 Tolerance compensation subassembly
90 Tolerance compensation region
92 First fixing region
94 First fixing opening
96 Second fixing opening
98 Fixing bolt
100 Bolt fixing region
102 Tooth structure
104 Friction coating
106 Second fixing region
108 Hollow space
110 Hollow space wall
112 Hollow space fixing region
114 Tooth structure
116 Friction coating
118 Fixing actuator
120 Actuator element
122 Actuator fixing region
124 Upper actuator side
126 Lower actuator side
128 Tooth structure
130 Friction coating
132 Bolt fixing actuator
134 Bolt actuator fixing region
136 Tooth structure
138 Friction coating
140 Hollow space free region

The invention claimed is:

1. A tolerance compensation subassembly which is constructed to compensate for a dimensional tolerance between a plurality of aircraft components which are intended to be fixed to each other, wherein the tolerance compensation subassembly comprises:
a fixing region for one of the aircraft components, and
a fixing actuator which contains an electro-active material, and
wherein the fixing actuator is electrically switchable between a fixed state, in which the fixing region is fixed, and a non-fixed state, in which the fixing region is displaceable,
wherein the fixing actuator is in the fixed state when no voltage is applied, and,
wherein the fixing actuator is in the non-fixed state as long as a voltage is applied.

2. The tolerance compensation subassembly as claimed in claim 1, wherein the fixing region is partially arranged on the fixing actuator so that the fixing region is displaced by displacing the fixing actuator.

3. The tolerance compensation subassembly as claimed in claim 1, wherein the fixing region comprises a fixing opening which is formed in the fixing actuator so that the fixing opening can be displaced by displacing the fixing actuator.

4. The tolerance compensation subassembly as claimed in claim 1,
wherein the fixing actuator is arranged in a hollow space,
wherein the fixing actuator in the fixed state grips in a positive-locking or non-positive-locking manner for fixing a region of the hollow space,
wherein the fixing actuator is displaceable in the non-fixed state within the hollow space.

5. The tolerance compensation subassembly as claimed in claim 4, wherein the hollow space has a hollow space fixing region which grips in the fixed state in a positive-locking or non-positive-locking manner for fixing another fixing region.

6. The tolerance compensation subassembly as claimed in claim 5, wherein the hollow space fixing region has at least one of a tooth structure or a friction coating for fixing.

7. The tolerance compensation subassembly as claimed in claim 1, wherein the fixing actuator has an actuator fixing region which grips in the fixed state in a positive-locking or non-positive-locking manner for fixing another fixing region.

8. The tolerance compensation subassembly as claimed in claim 7, wherein the actuator fixing region has at least one of a tooth structure or a friction coating for fixing.

9. The tolerance compensation subassembly as claimed in claim 1, wherein the fixing actuator comprises a plate.

10. The tolerance compensation subassembly as claimed in claim 1, wherein in the non-fixed state the fixing region is displaceable parallel with a displacement plane which is defined by the fixing actuator.

11. The tolerance compensation subassembly as claimed in claim 1, having a housing which delimits a plurality of hollow spaces, wherein the fixing actuator is constructed as a stack actuator with a plurality of actuator elements, wherein each hollow space contains an actuator element.

12. The tolerance compensation subassembly as claimed in claim 1, having a bolt fixing actuator for fixing a fixing bolt,
   wherein the fixing region has the fixing bolt,
   wherein the bolt fixing actuator contains an electro-active material, and is thereby electrically switchable between a fixed state, in which the fixing bolt is fixed, and a non-fixed state, in which the fixing bolt is displaceable along a longitudinal axis thereof.

13. The tolerance compensation subassembly as claimed in claim 12, wherein the bolt fixing actuator is constructed as part of the fixing actuator and delimits the fixing opening in a radial direction.

14. The tolerance compensation subassembly as claimed in claim 12, wherein the bolt fixing actuator is arranged on a peripheral face of the fixing bolt.

15. An aircraft component of an aircraft, wherein the aircraft component comprises the tolerance compensation subassembly as claimed in claim 1.

16. An aircraft having the tolerance compensation subassembly as claimed claim 1.

17. The tolerance compensation subassembly as claimed in claim 1, wherein the electro-active material comprises an electro-active polymer.

\* \* \* \* \*